(12) United States Patent
Liu et al.

(10) Patent No.: US 11,069,825 B2
(45) Date of Patent: Jul. 20, 2021

(54) OPTOELECTRONIC DEVICES FORMED OVER A BUFFER

(71) Applicant: IQE plc, Cardiff (GB)

(72) Inventors: Amy Wing Kwan Liu, Mountain View, CA (US); Dmitri Lubyshev, Bethlehem, PA (US); Joel Mark Fastenau, Bethlehem, PA (US); Scott Alan Nelson, River Falls, WI (US); Michael Vincent Kattner, Lehighton, PA (US); Philip Lee Frey, Bethlehem, PA (US); Matthew Fetters, Allentown, PA (US); Hubert Krysiak, New Tripoli, PA (US); Zhaoquan Zeng, Bethlehem, PA (US); Aled Owen Morgan, Cardiff (GB); Stuart Andrew Edwards, Cowbridge (GB)

(73) Assignee: IQE plc, Cardiff (GB)

( * ) Notice: Subject to any disclaimer, the term of this patent is extended or adjusted under 35 U.S.C. 154(b) by 0 days.

(21) Appl. No.: 16/424,292

(22) Filed: May 28, 2019

(65) Prior Publication Data
US 2019/0371947 A1    Dec. 5, 2019

Related U.S. Application Data

(60) Provisional application No. 62/677,563, filed on May 29, 2018.

(51) Int. Cl.
*H01L 31/0336* (2006.01)
*H01L 31/036* (2006.01)
(Continued)

(52) U.S. Cl.
CPC ........ *H01L 31/0336* (2013.01); *H01L 31/036* (2013.01); *H01L 31/18* (2013.01); *H01L 31/028* (2013.01); *H01L 31/0304* (2013.01)

(58) Field of Classification Search
CPC ... H01L 31/0336; H01L 31/036; H01L 31/18; H01L 31/028; H01L 31/0304; H01L 31/03046; H01L 31/101
See application file for complete search history.

(56) References Cited

U.S. PATENT DOCUMENTS

| | | | | |
|---|---|---|---|---|
| 2003/0219954 A1* | 11/2003 | Baba | ................. | H01L 21/76264 438/373 |
| 2006/0108604 A1* | 5/2006 | Blayac | ................. | H01L 29/205 257/197 |

(Continued)

OTHER PUBLICATIONS

Burguete et al., "Direct Growth of InAs/GaSb type II superlattice photodiodes on silicon substrates," IET Optoelectronics, vol. 12, Iss. 1, (2018), pp. 2-4.

(Continued)

*Primary Examiner* — Marcos D. Pizarro
*Assistant Examiner* — Sue Tang
(74) *Attorney, Agent, or Firm* — Sterne, Kessler, Goldstein & Fox P.L.L.C.

(57) ABSTRACT

An optoelectronic device includes an Sb-based metamorphic photodetector grown over a silicon substrate via a buffer layer. The device includes a layered structure. The layered structure can include a silicon substrate, a buffer layer formed over the Si substrate, and an infrared photodetector formed over the buffer layer. In some embodiments, the buffer layer includes a composite buffer layer having sublayers. For example, the composite buffer layer includes a Ge-based sublayer formed over the substrate, a III-As sublayer grown over the Ge-based sublayer, and a III-Sb sublayer formed over the III-As sublayer.

17 Claims, 5 Drawing Sheets

(51) Int. Cl.
*H01L 31/18* (2006.01)
*H01L 31/028* (2006.01)
*H01L 31/0304* (2006.01)

(56) References Cited

U.S. PATENT DOCUMENTS

| | | | | |
|---|---|---|---|---|
| 2006/0146161 | A1* | 7/2006 | Farrier | H04N 5/35545 348/308 |
| 2008/0179547 | A1* | 7/2008 | Henley | H01L 31/1804 250/492.21 |
| 2012/0223362 | A1 | 9/2012 | Belenky et al. | |
| 2014/0225064 | A1* | 8/2014 | Khoshakhlagh | H01L 21/02549 257/21 |
| 2016/0372624 | A1* | 12/2016 | Yanka | H01L 31/03044 |

OTHER PUBLICATIONS

Castellano et al., "Room-temperature continuous-wave operation in the telecom wavelength range of GaSb-based lasers monolithically grown on Si," APL Photonics 2, pp. 061301-1 to 061301-5 (2017); doi: 10.119063/1.4983389.

Cerba et al., "Anti phase boundary free GaSb layer grown on 300 mm (001)-Si substrate by metal organic chemical vapor deposition," Elsevier, Thin Solid Films 645 (2018) 5 pages.

Fastenau et al., "GaSb-Based Infrared Photodetector Structures Grown on Ge—Si Substrates via Metamorphic Buffers," Proc. of SPIE, vol. 11002, Downloaded from https://www.spiedigitallibrary.org/conference-proceedings-of-spie on Sep. 6, 2019, 8 pages.

Fastenau et al., "MBE Growth of GaSb-based Photodetectors on 6-inch Diameter GaAs Substrates via Select Buffers," J. Vac. Sci. Technol. B 31(3), May/Jun. 2013, 6 pages.

Gong et al., "Enabling Hetero-integration of III-V and Ge-based Transistors on Silicon with Ultra-thin Buffers Formed by Interfacial Misfit Technique," ECS Transactions, 75 (8) 421-437 (2016).

Nguyen et al., "HOT MWIR Detectors on Silicon Substrates," Proceedings of SPIE, vol. 10624, downloaded from https://www.spiedigitallibrary.org/conference-proceedings-of-spie on May 14, 2019, 11 pages.

Perez et al., "Midwave Infrared Detector Based on Ga-free InAs/InAsSb Type II Superlattice Grown by Molecular Beam Epitaxy on Si Substrate," Universite De Montpellier, Undated, 13 pages.

Rodriguez et al., "Room-temperature Operation on a 2.25 µm Electrically Pumped Laser Fabricated on a Silicon Substrate," Applied Physics Letters 94, 061124 (2009), Downloaded Feb. 16, 2009, http://apl.aip.org/apl/copyright.jsp, 2 pages.

Van et al., "Quantum Cascade Lasers Grown on Silicon," Scientific Reports (2018) 8:7206, DOI:10.1038/s41598-018-24723-2, 8 pages.

Zhang et al., "Thin-Film Antimonide-Based Photodetectors Integrated on Si," IEEE Journal of Quantum Electronics, vol. 54, No. 2, Apr. 2018, 7 pages.

* cited by examiner

OPTOELECTRONIC DEVICES FORMED OVER A BUFFER

CROSS-REFERENCE TO RELATED APPLICATIONS

This disclosure claims the benefit of U.S. Provisional Patent Application No. 62/677,563 filed May 29, 2018, the disclosure of which is hereby incorporated by reference herein in its entirety.

FIELD OF USE

The present disclosure is directed towards optoelectronic devices and, more particularly, the present disclosure is directed towards a optoelectronic devices formed on a buffer layer over a substrate.

BACKGROUND

Conventional infrared (IR) detectors that use Antimony (Sb)-based alloys are frequently bonded, or affixed using Indium (In) bumps, to a silicon-based read-out integrated circuit (ROIC) wafer to create a focal plane array (FPA). The process to manufacture such structures using Sb-based alloys to bond conventional IR detectors requires additional fabrication steps that may complicate the ROIC process. Additionally, techniques based on In bumps may also introduce thermal management issues.

SUMMARY

In some embodiments, an optoelectronic device may include an Antimony (Sb)-based metamorphic photodetector grown over a Silicon (Si) substrate via a buffer layer. The device includes a layered structure. Here, the adjective "metamorphic" is used to indicate the epitaxial growth of one crystal structure on top of another where the two have dissimilar crystal lattice spacing. In some embodiments, the layered structure includes a substrate, a buffer layer formed over the substrate, and an infrared photodetector formed over the buffer layer. In some embodiments, the buffer layer includes a composite buffer layer having sublayers. For example, in some embodiments, a composite buffer layer includes a Germanium (Ge) based sublayer formed over the substrate, a III-Arsenic (III-As) sublayer grown over the Ge-based sublayer, and a III-Sb sublayer formed over the III-As sublayer.

BRIEF DESCRIPTION OF THE DRAWINGS

The present disclosure, in accordance with one or more various embodiments, is described in detail with reference to the following figures. The drawings are provided for purposes of illustration only and merely depict typical or example embodiments. These drawings are provided to facilitate an understanding of the concepts disclosed herein and shall not be considered limiting of the breadth, scope, or applicability of these concepts. It should be noted that for clarity and ease of illustration these drawings are not necessarily made to scale.

DETAILED DESCRIPTION

Structures and methods described herein are directed to optoelectronic devices formed including buffer layers. In some embodiments, an optoelectronic device includes an Sb-based metamorphic photodetector grown over a silicon substrate via a buffer layer. For example, the buffer layer may include a composite Ge/III-As/III-Sb buffer layer. In an illustrative example, IR photodetectors may be formed as part of a focal-plane array (FPA), which may be used for spectroscopic observation (e.g., in conjunction with telescope systems, or other optical systems), IR sensing, imaging, or a combination thereof.

Optoelectronic devices, such as IR photodetectors, may be based on GaSb materials, which provide rich bandgap engineering possibilities such as, for example, type-II broken-gap alignments. These bandgap properties allow for many device architectures. For example, the device architectures may be based on unipolar barrier design concepts, which may be referred to as "nBn" or "XBn." Manufacturing nBn-based, larger-format FPA detectors require larger diameter wafer substrates for improved throughput, volumes, and yield, for example. In some embodiments, the present disclosure provides a layered structure integrating an Sb-based metamorphic optoelectronic device. The optoelectronic device may include an IR photodetector based on a unipolar design in a single epitaxial stack, which allows the epitaxial stack to support large area FPAs. Integration of the IR detector provides the combined advantages of high-level volume production of Si-based electronic circuitry, high speed, and desired optical performance of III-V materials that may be part of the epitaxial stack. In some embodiments, the silicon substrate includes a silicon wafer with suitable circuitry (e.g., complementary metal-oxide-semiconductor (CMOS) compatible circuitry) already processed into the wafer. For example, a ROIC may be processed into the wafer. In a further example, the ROIC may be arranged either directly below the photodetector epitaxy or in an adjacent portion of the substrate (e.g., adjacent to the buffer layer and photodetector structure). In some embodiments, the formation of the ROIC on the substrate improves thermal management of the epitaxial stack.

Figure 1:
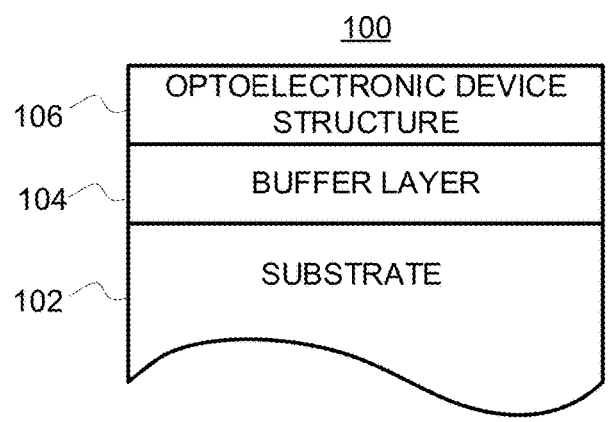
FIG. 1 shows a cross-sectional view of an illustrative layered structure having an optoelectronic device over a substrate, in accordance with some embodiments of the present disclosure.

FIG. 1 shows a cross-sectional view of illustrative layered structure 100 having optoelectronic device 106 over substrate 102, in accordance with some embodiments of the present disclosure.

In some embodiments, substrate 102 includes a silicon wafer having a predetermined crystal orientation. For example, substrate 102 may include a crystalline silicon substrate having a crystal orientation of <100>. In a further example, substrate 102 may include a (100) surface with a miscut (e.g., 6° or any other suitable orientation) towards the [111] orientation as the surface upon which buffer layer 104 is formed. In some embodiments, substrate 102 includes one or more preformed circuits or devices. For example, substrate 102 may include an ROIC or other suitable circuit (e.g., CMOS compatible circuit). Substrate 102 may include any suitable material, regions thereof, devices, circuits, regions including devices, regions including circuits, or any combination thereof.

Buffer layer 104 is formed over substrate 102. As shown in FIG. 1, buffer 104 may be formed directly over substrate 102. In some embodiments, buffer layer 104 is formed by metamorphic epitaxy over substrate 102. In some embodiments, buffer layer 104 includes more than one layer, each layer formed from a suitable material. Buffer layer 104 is included to provide a transition between substrate 102 and optoelectronic device 106. The transition may include a chemical transition, a lattice constant transition, a transition in material properties, any other suitable transition, or any combination thereof. Further details of a buffer layer are described in the context of FIG. 2, for example.

Optoelectronic device 106 is formed over buffer layer 104. In some embodiments, optoelectronic device 106 includes one or more alloys of group-III and group-V elements. In some embodiments, optoelectronic device 106 may include more than one element of group V along with an element of group III. For example, optoelectronic device 106 may include $InAs_zSb_{1-z}$, $AlAs_zSb_{1-z}$, $GaAs_zSb_{1-z}$, for which $0 \leq z \leq 1$. In some embodiments, optoelectronic device 106 includes more than one group-III element in addition to multiple group-V elements. For example, optoelectronic device 106 may include, $In_xAl_yGa_{1-x-y}As_zSb_{1-z}$ for which $0 \leq x \leq 1$, $0 \leq y \leq 1$, $0 \leq x+y \leq 1$, and $0 \leq z \leq 1$.

Figure 2:
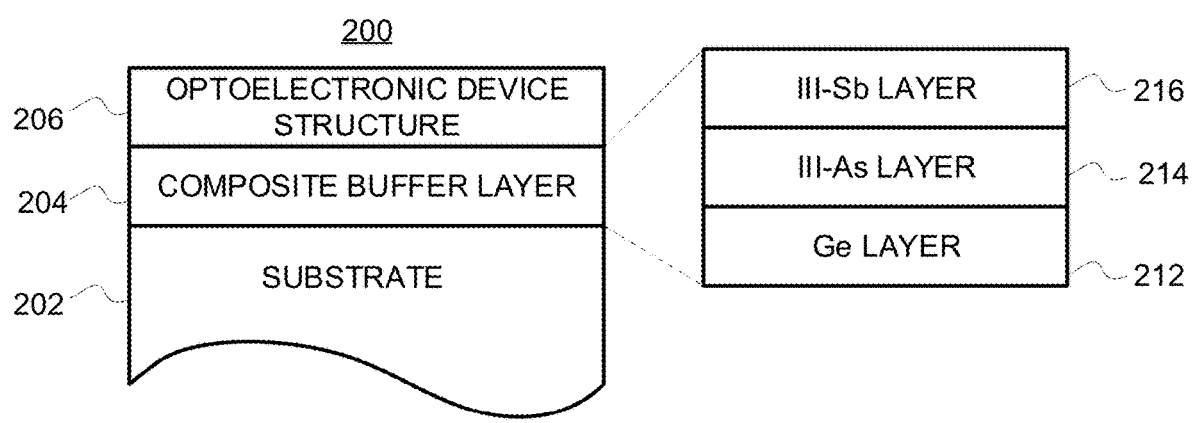
FIG. 2 shows a cross-sectional view of an illustrative layered structure having an optoelectronic device over a substrate and a composite buffer, in accordance with some embodiments of the present disclosure.

FIG. 2 shows a cross-sectional view of illustrative layered structure 200 having optoelectronic device 206 over substrate 202 and composite buffer layer 204, in accordance with some embodiments of the present disclosure. In some embodiments, layered structure 200 is an example of layered structure 100 of FIG. 1, wherein composite buffer layer 204 is an example of buffer layer 104.

In some embodiments, substrate 202 includes a silicon wafer having a predetermined crystal orientation. For example, substrate 202 may include a crystalline silicon substrate having a crystal orientation of <100>. In some embodiments, substrate 202 includes one or more preformed circuits or devices. For example, substrate 202 may include an ROIC or other suitable circuit. Substrate 202 may include any suitable material, regions thereof, devices, circuits, regions including devices, regions including circuits, or any combination thereof.

Composite buffer layer 204 is formed over substrate 202. As shown in FIG. 2, composite buffer layer 204 may be formed directly over substrate 202, layer-by-layer. In some embodiments, one or more layers of composite buffer layer 204 is formed by metamorphic epitaxy over substrate 202 or previous layers of composite buffer layer 204. Composite buffer layer 204 provides a transition between substrate 202 and optoelectronic device 206. The transition may include a chemical transition, a lattice constant transition, a transition in material properties, any other suitable transition, or any combination thereof. As illustrated, composite buffer layer 204 includes three sublayers (e.g., layers belonging to a group of layers). Germanium (Ge) layer 212 is formed over substrate 202. For example, Ge layer 212 may be epitaxially formed over substrate 202. In a further example, Ge layer 212 may be formed over substrate 202 in a chemical vapor deposition (CVD) reaction chamber. An As-based layer (e.g., III-As layer 214) is formed over Ge layer 212. An antimony-based layer (e.g., III-Sb layer 216) is formed over III-As layer 214. For example, III-Sb layer 216 may be formed over III-As layer 214 via an epitaxy process.

Optoelectronic device 206 is formed over composite buffer layer 204. For example, optoelectronic device 206 is formed over III-Sb layer 216. In some embodiments, optoelectronic device 206 includes one or more alloys of group-III and group-V elements. In some embodiments, optoelectronic device 206 may include more than one element of group V along with an element of group III. For example, optoelectronic device 206 may include $InAs_zSb_{1-z}$, $AlAs_zSb_{1-z}$, $GaAs_zSb_{1-z}$, for which $0 \leq z \leq 1$. In some embodiments, optoelectronic device 206 includes more than one group-III element in addition to multiple group-V elements. For example, optoelectronic device 206 may include $In_xAl_yGa_{1-x-y}As_zSb_{1-z}$, for which $0 \leq x \leq 1$, $0 \leq y \leq 1$, $0 \leq x+y \leq 1$, and $0 \leq z \leq 1$. In some embodiments, device layers (e.g., of optoelectronic device 206) may be doped to suitable electronic conductivity levels as needed for device operation. For example, some such dopants include Si, Beryllium (Be), and Tellurium (Te).

The data presented in plots 300, 400, 500, and 600 of respective FIGS. 3-6 correspond to a layered structure similar to layered structure 200 of FIG. 2. The layered structure includes a silicon substrate, with composite buffer layer and a Sb-based photodetector formed over the buffer layer (e.g., a photodiode). The data presented in FIGS. 3-6 are from large-area, mesa diodes without passivation or an anti-reflection coating. The device performance was measured at 150 K with front side illumination, and with a 3.1 µm bandpass filter for plot 300 of FIG. 3.

Figure 3:
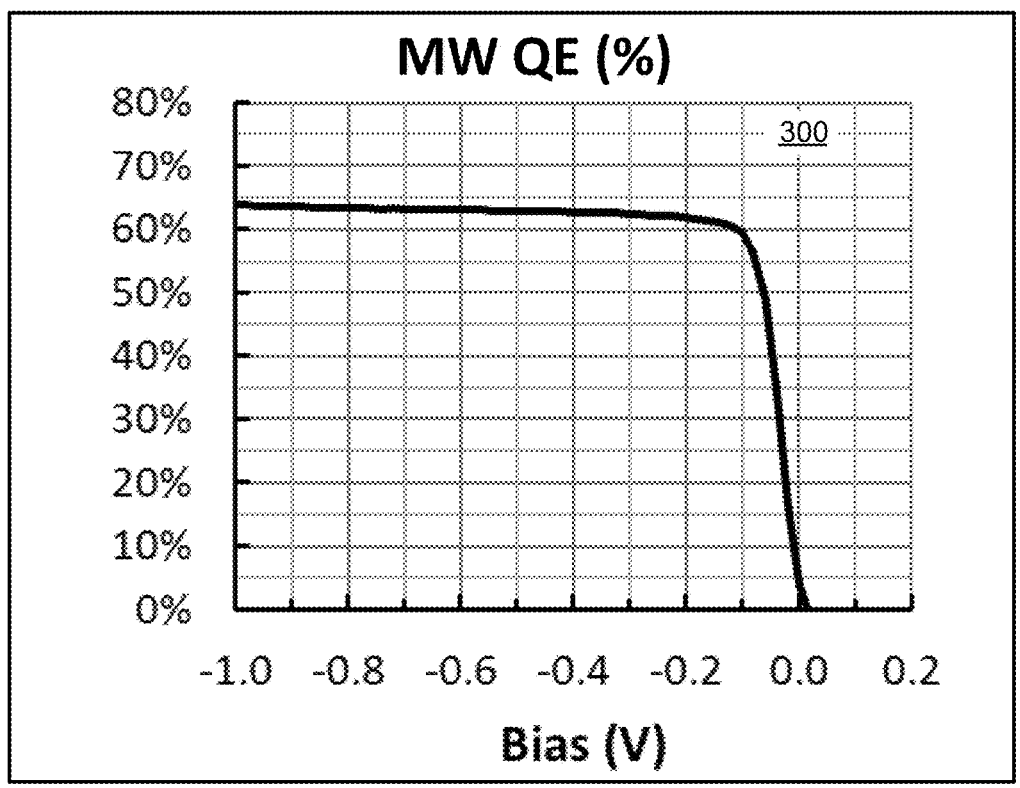
FIG. 3 shows a plot of quantum efficiency as a function of bias voltage for an illustrative layered structure, in accordance with some embodiments of the present disclosure.

FIG. 3 shows plot 300 of quantum efficiency as a function of bias voltage for an illustrative layered structure, in accordance with the present disclosure. Quantum efficiency is a measure of what percentage of incident light is converted to electricity. Plot 300 shows data for an illustrative structure similar to layered structure 200 of FIG. 2. For example, as illustrated by plot 300, quantum efficiencies over 60% may be achieved at bias voltages of approximately −0.1 V or less.

Figure 4:
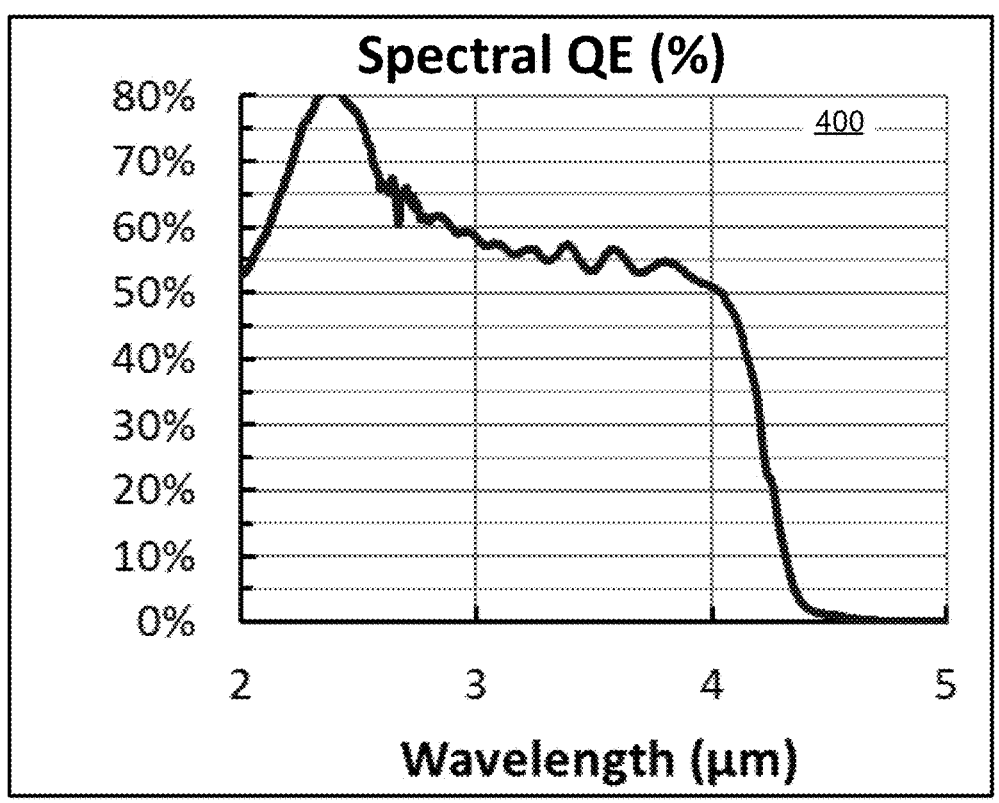
FIG. 4 shows a plot of quantum efficiency as a function of wavelength for an illustrative layered structure, in accordance with some embodiments of the present disclosure.

FIG. 4 shows plot 400 of quantum efficiency as a function of wavelength for an illustrative layered structure, in accordance with the present disclosure. The wavelength corresponds to the wavelength of light incident at an illustrative structure similar to layered structure 200 of FIG. 2. For example, as illustrated by plot 400, quantum efficiencies above 50% may be achieved in the spectral range of approximately 2-4 microns (e.g., short to mid-wavelength IR).

Figure 5:
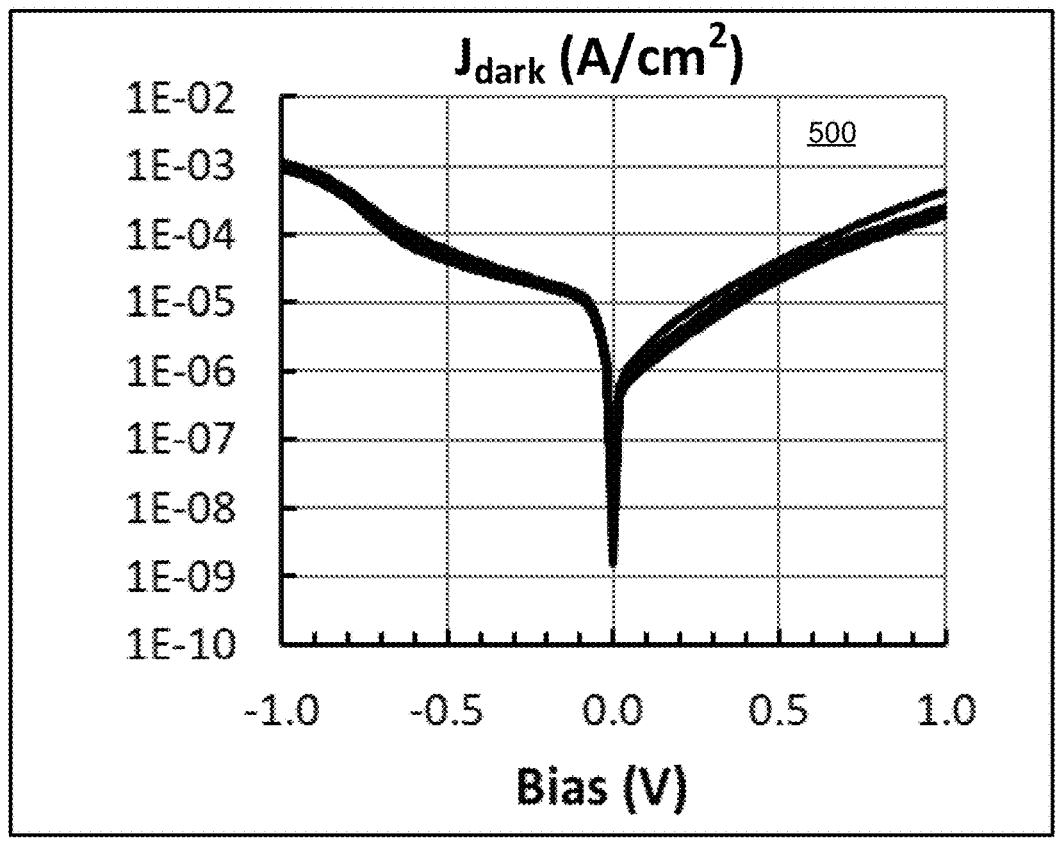
FIG. 5 shows a plot of dark current density as a function of bias voltage for an illustrative layered structure, in accordance with some embodiments of the present disclosure.

FIG. 5 shows plot 500 of dark current density as a function of bias voltage for an illustrative layered structure, in accordance with the present disclosure. Dark current density (e.g., without incident radiation) may provide an indicator of electrical noise of a photodetector. Plot 500 shows dark current density results for an illustrative structure similar to layered structure 200 of FIG. 2. For example, plot 500 shows a dark current density of approximately $2 \times 10^{-5}/cm^2$ at a bias voltage of −0.2 V.

Figure 6:
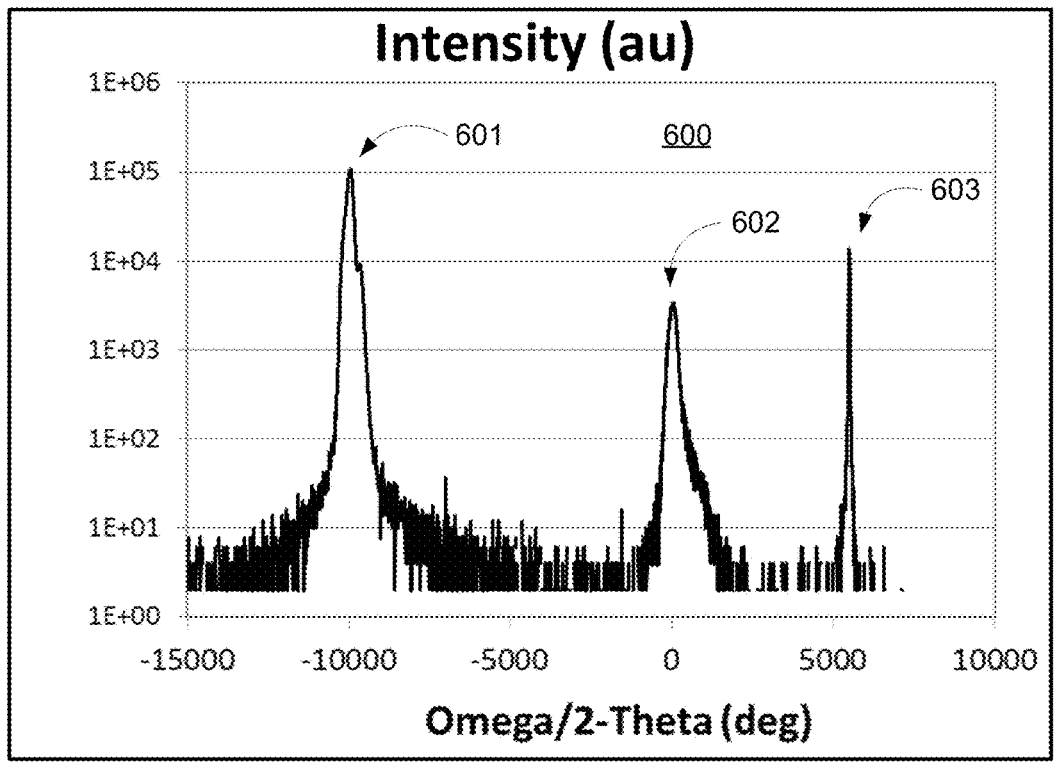
FIG. 6 shows a plot of an X-ray diffraction spectrum for an illustrative layered structure, in accordance with some embodiments of the present disclosure.

Various techniques may be used at the epitaxial level to evaluate the layered structures (e.g., layered structure 100 of FIG. 1 or layered structure 200 of FIG. 2). For example, X-ray diffraction (XRD) techniques may be used to identify crystal lattices and orientations thereof. FIG. 6 shows plot 600 of an XRD spectrum for an illustrative layered structure, in accordance with the present disclosure. Plot 600 shows an illustrative, high-resolution XRD spectrum having three distinct peaks, arising from 1) the III-Sb buffer sublayer and nBn photodetector structure (e.g., marker 601), 2) the GaAs (e.g., III-As buffer sublayer) and Ge buffer sublayers (e.g., marker 602), and 3) the silicon substrate (e.g., marker 603). The relatively sharp peak from the III-Sb and photodetector layers is indicative of excellent structural properties and effectiveness of the underlying buffer design.

Figure 7:
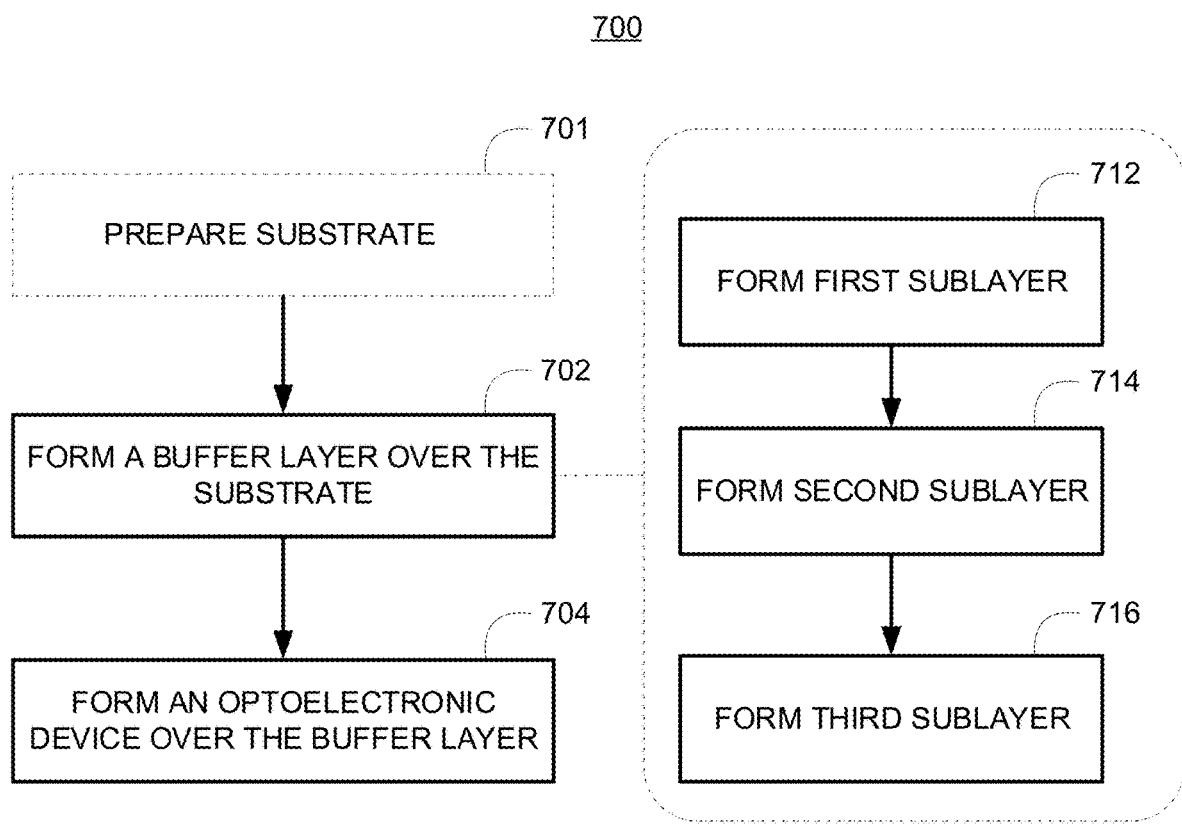
FIG. 7 is a flowchart of an illustrative process for making a layered structure, in accordance with some embodiments of the present disclosure.

FIG. 7 is a flowchart of illustrative process 700 for making a layered structure, in accordance with the present disclosure. For example, illustrative layered structures 100 and 200 of respective FIGS. 1-2 may be formed by process 700.

Step 701 includes preparing a substrate. Step 701 may include growing a single crystal wafer, forming a silicon wafer, treating or otherwise preparing a surface of a substrate, forming one or more circuits on a substrate, forming one or more devices on a substrate, any other suitable actions to prepare a substrate for further processing, or any combination thereof. The substrate may include, for example, a crystalline substrate with a miscut surface (e.g., miscut (100) surface), a substrate including CMOS circuitry, silicon on insulator, Ge-on-insulator, Ge, silicon-on-lattice-engineered-substrate (SOLES), any other suitable substrate having an associated lattice constant, or any combination thereof.

Step 702 includes forming a buffer layer over the substrate of step 701. In some embodiments, step 702 includes forming the buffer layer directly over the substrate. In some embodiments, step 702 includes forming the buffer layer using metamorphic epitaxy, wherein the buffer layer is an epitaxial layer having a lattice constant different than the substrate. For example, in some embodiments, step 702 is performed at least partially in a molecular beam epitaxy (MBE) reaction chamber. In a further example, in some embodiments, step 702 is performed at least partially in a chemical vapor deposition (CVD) reaction chamber. In some embodiments, step 702 includes forming a multilayer buffer, in which more than one sublayer is formed. For example, step 702 may include steps 712, 714, and 716 as illustrated. In a further example, the sublayers may be formed directly over the substrate and each other, in sequence. In some embodiments, step 702 includes processing the structure in more than one chamber, using more than one process.

Step 712 includes forming a first sublayer over the substrate. The first sublayer may include a Ge-based material formed over the substrate. In some embodiments, step 712 includes forming the first sublayer directly over the substrate. In some embodiments, step 712 includes forming the first sublayer using metamorphic epitaxy. In an illustrative example, step 712 may include forming a Ge layer over the substrate (e.g., which may be 0.5-1.0 micron thick or any other suitable thickness). In a further illustrative example, a liquid phase chemical vapor deposition (CVD) tool may be used to form a seeding layer followed by a bulk Ge layer. In some embodiments, step 712 includes surface preparation of the substrate. For example, $H_2$ may be used to remove native oxides on the surface of the substrate prior to formation of the first sublayer. In an illustrative example, in which a silicon substrate and a Ge first sublayer are used, the structure resulting from step 712 may be referred to as a germanium-on-silicon (Ge—Si) substrate. In an illustrative example, the Ge—Si substrate may be removed from CVD processing and then introduced to MBE reaction chamber for further processing.

Step 714 includes forming a second sublayer over the first sublayer. The second sublayer may include a III-As material (i.e., a group-III element and Arsenic) formed over the first layer. In some embodiments, step 714 includes forming the second sublayer directly over the first sublayer. In some embodiments, step 714 includes forming the second sublayer using metamorphic epitaxy. For example, step 714 may include applying MBE to a surface of the first sublayer to form the second sublayer. In an illustrative example, one or more valved cracker sources may be used to provide the group-V material (e.g., As and/or Sb). In a further illustrative example, one or more SUMO cells or conical effusion cells may be used to provide group-III materials (e.g., Al, Ga, and/or In). To illustrate, the second sublayer may be a GaAs sublayer.

Step 716 includes forming a third sublayer over the second sublayer. The third sublayer may include a III-Sb material (i.e., a group-III element and Antimony) formed over the second layer. In some embodiments, step 716 includes forming the third sublayer directly over the second sublayer. In some embodiments, step 716 includes forming the second sublayer using metamorphic epitaxy. Because the third sublayer may be Antimony-based, antimony-based photodetector structures may be more easily formed epitaxially over the third sublayer. For example, the lattice constant of the third sublayer may be similar to that of an optoelectronic device structure formed at step 704. In some embodiments, step 716 may include applying molecular beam epitaxy (MBE) to a surface of the second sublayer to form the third sublayer. In an illustrative example, one or more valved cracker sources may be used to provide the group-V material. In a further illustrative example, one or more SUMO cells or conical effusion cells may be used to provide group-III materials (e.g., Al, Ga, and/or In). In some embodiments, steps 714 and 716 are performed in the same reaction chamber (e.g., an MBE chamber).

Step 704 includes forming an optoelectronic device over the buffer layer of step 702. The IR photodetector may include an Sb-based material formed over the buffer layer. In some embodiments, step 704 includes forming the optoelectronic device directly over the buffer layer (e.g., the third sublayer of a composite buffer layer). In some embodiments, step 704 includes forming an IR photodetector using metamorphic epitaxy. For example, step 704 may include forming the IR photodetector by forming an approximately 4 micron thick absorber layer (e.g., an InAsSb absorber layer), then forming a barrier layer (e.g., an AlAsSb barrier layer) over the absorber layer, and then forming a top contact layer (e.g., a Si-doped InAsSb contact layer) over the barrier layer. In a further example, the IR photodetector may be a Sb-based nBn photodetector. In some embodiments, the IR photodetector has a cutoff wavelength of approximately 4 microns.

In an illustrative example, process 700 may include full-wafer epitaxial growth of an entire metamorphic photodetector structure on Si, using a Ge-containing buffer layer. In some embodiments, process 700 is a flexible, multi-step, Si-to-Ge-to-III-V, M-buffer approach for forming Sb-based optoelectronic devices such as IR detectors.

Figure 8:
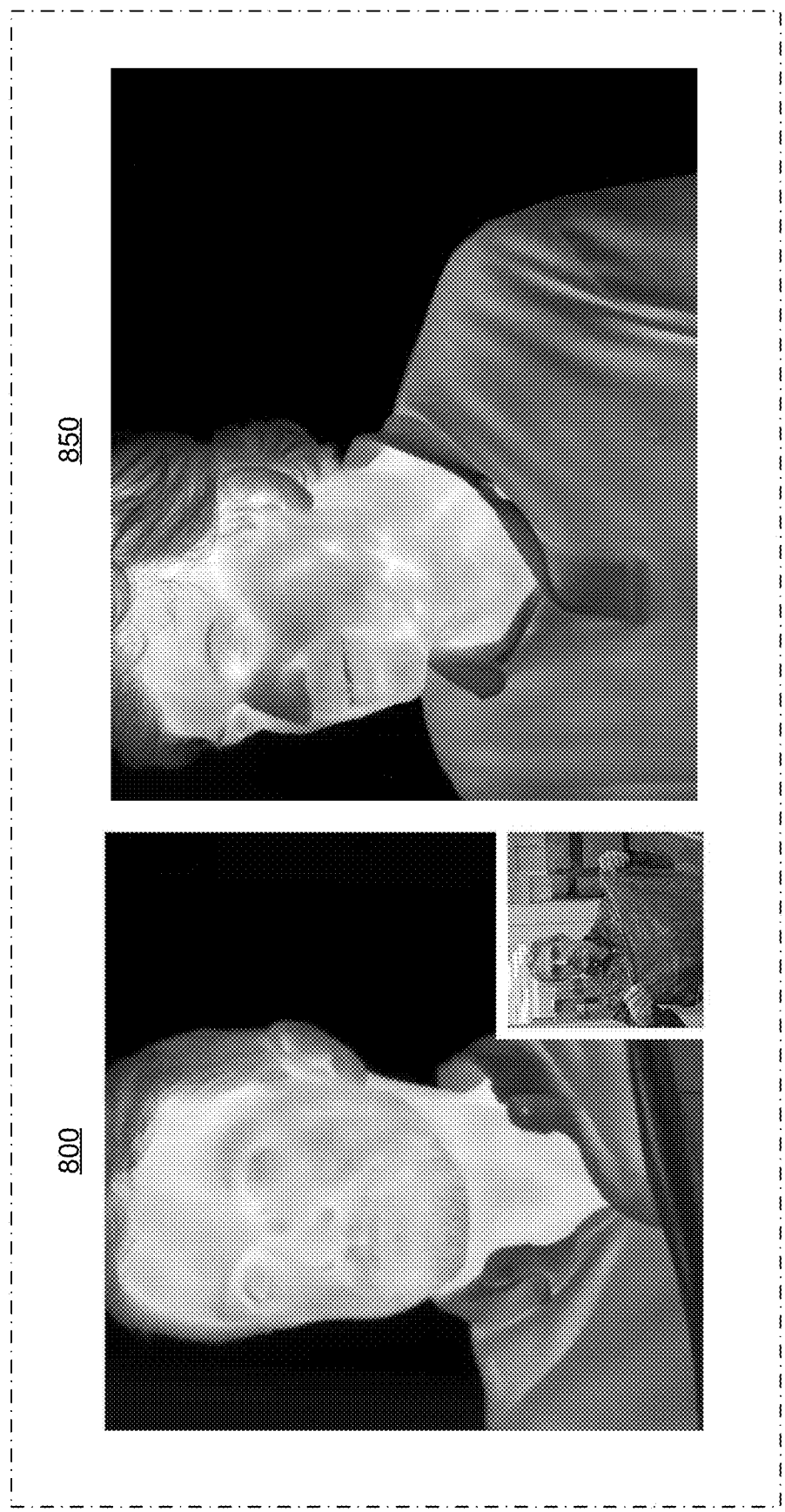
FIG. 8 shows two images generated using layered structures having Sb-based photodetectors, in accordance with the present disclosure.

FIG. 8 shows images 800 and 850 generated using layered structures having Sb-based IR photodetectors, in accordance with the present disclosure. Both IR images 800 and 850 were generated at 77 K using a focal plane array including a plurality of nBn-type IR photodetectors formed on a Ge—Si substrate. Accordingly, high quality photodetection may be achieved using the metamorphic-epitaxy-formed structures of the present disclosure. Image 800 includes an inset showing an image taken with visible-range photography for reference.

Throughout this disclosure, monolithically-integrated means formed on the surface of the substrate, typically by depositing layers disposed on the surface.

Disposed on means "exists on" an underlying material or layer. This layer may comprise intermediate layers, such as transitional layers, necessary to ensure a suitable surface. For example, if a material is described to be "disposed on a substrate," this may mean either (1) the material is in intimate contact with the substrate; or (2) the material is in contact with one or more transitional layers that reside on the substrate.

Single-crystal means a crystalline structure that comprises substantially only one type of unit cell. A single-crystal layer, however, may exhibit some crystalline defects such as stacking faults, dislocations, or other commonly occurring crystalline defects.

Single-domain means a crystalline structure that comprises substantially only one structure of unit-cell and substantially only one orientation of that unit cell. In other words, a single-domain crystal exhibits no twinning or anti-phase domains.

Single-phase means a crystalline structure that is both single-crystal and single-domain.

Substrate means the material on which deposited layers are formed. Exemplary substrates include, without limitation: bulk silicon wafers in which a wafer includes a homogeneous thickness of single-crystal silicon, composite wafers such as a silicon-on-insulator wafer that includes a layer of silicon that is formed on a layer of silicon dioxide that is formed on a bulk silicon wafer, or any other suitable material that serves as base layer upon which, or in which, devices are formed. Examples of such other materials that are suitable, as a function of the application, for use as substrate layers and bulk substrates include, without limitation, germanium, alloys of group IV elements such as SiGe, SiGeSn, GeSn, alumina, gallium-arsenide, indium-phosphide, silica, silicon dioxide, borosilicate glass, pyrex, and sapphire. In some non-limiting examples, the substrate layer may include one or more portions or sublayers of porous material with the same or different porosities.

Miscut Substrate means a substrate which comprises a surface crystal structure that is oriented at an angle to that associated with the crystal structure of the substrate. For example, a 6° miscut <100> silicon wafer comprises a <100> silicon wafer that has been cut at an angle to the <100> crystal orientation by 6° toward another major crystalline orientation, such as <111>. Typically, but not necessarily, the miscut will be up to about 20°. Unless specifically noted, the phrase "miscut substrate" includes miscut wafers having any major crystal orientation. That is, a <111> wafer miscut toward the <011> direction, a <100> wafer miscut toward the <110> direction, and a <011> wafer miscut toward the <001> direction.

A first layer described and/or depicted herein as "on" or "over" a second layer may be immediately adjacent to the second layer, or one or more intervening layers may be between the first and second layers. A first layer that is described and/or depicted herein as "directly on" or "directly over" a second layer or a substrate is immediately adjacent to the second layer or substrate with no intervening layer present, other than possibly an intervening alloy layer that may form due to mixing of the first layer with the second layer or substrate. In addition, a first layer that is described and/or depicted herein as being "on," "over," "directly on," or "directly over" a second layer or substrate may cover the entire second layer or substrate, or a portion of the second layer or substrate.

The top surface of a substrate is the surface to receive one or more epitaxial layers (e.g., an "epi-ready" surface). As layers are formed, the "top" surface, or "upper" surface, is the layer furthest from the substrate. Any of the structures depicted and described herein may be part of larger structures with additional layers above and/or below those depicted. For clarity, the figures herein may omit these additional layers, although these additional layers may be part of the structures disclosed. In addition, the structures depicted may be repeated in units, even if this repetition is not depicted in the figures.

The foregoing is merely illustrative of the principles of this disclosure and various modifications may be made by those skilled in the art without departing from the scope of this disclosure. The above described embodiments are presented for purposes of illustration and not of limitation. The present disclosure also can take many forms other than those explicitly described herein. Accordingly, it is emphasized that this disclosure is not limited to the explicitly disclosed methods, systems, and apparatuses, but is intended to include variations to and modifications thereof, which are within the spirit of the following claims.

What is claimed is:

1. A layered structure comprising:
   a silicon-based substrate having a crystallographic orientation;
   a buffer layer formed over the silicon-based substrate, wherein the buffer layer comprises:
   a Ge-based layer formed over the silicon-based substrate;
   a III-As layer formed over the Ge-based layer; and
   a metamorphic-epitaxial III-Sb layer formed over the III-As layer; and
   a metamorphic-epitaxial Sb-based optoelectronic device formed over the buffer layer,
      wherein the buffer layer has a lattice constant that transitions between a lattice constant of the silicon-based substrate and a lattice constant of the epitaxial Sb-based optoelectronic device.

2. The layered structure of claim 1, wherein the buffer layer is an epitaxial buffer layer formed directly over the silicon-based substrate.

3. The layered structure of claim 1, wherein the buffer layer comprises more than one layer.

4. The layered structure of claim 3, wherein each of the more than one layer is an epitaxial layer.

5. The layered structure of claim 1, wherein the buffer layer comprises:
   the Ge-based layer formed directly over the silicon-based substrate;
   the III-As layer formed directly over the Ge-based layer; and
   the epitaxial Sb-containing layer formed directly over the III-As layer.

6. The layered structure of claim 1, wherein the crystallographic orientation is a <100> surface miscut towards a <111> orientation.

7. The layered structure of claim 1, wherein the silicon-based substrate comprises a complementary-metal-oxide-semiconductor (CMOS) compatible circuit, and wherein the epitaxial Sb-based optoelectronic device comprises an infrared photodetector electrically coupled to the CMOS compatible circuit.

8. The layered structure of claim 1, wherein the epitaxial Sb-based optoelectronic device comprises an alloy comprising a group-V element and a group-III element.

9. The layered structure of claim 1, wherein the epitaxial Sb-based optoelectronic device comprises a material selected from the group consisting of $InAs_zSb_{1-z}$, $AlAs_zSb_{1-z}$, and $GaAs_zSb_{1-z}$, wherein z is a real number in the range of 0 to 1.

10. The layered structure of claim 1, wherein the epitaxial Sb-based optoelectronic device comprises a material of the group consisting of $In_xAl_yGa_{1-x-y}As_zSb_{1-z}$ wherein x, y, x+y, and z are real numbers in the range of 0 to 1.

11. The layered structure of claim 1, wherein the epitaxial Sb-based optoelectronic device comprises an infrared photodetector, and wherein the buffer layer provides the transition in lattice constant between the silicon-based substrate and an Sb-based absorber layer of the infrared photodetector.

12. A method for making a layered structure, the method comprising:
   forming a buffer layer over a silicon-based substrate, wherein forming the buffer layer comprises:
      forming a Ge-based layer over the silicon-based substrate,
      forming a III-As layer over the Ge-based layer; and
      forming a Sb-containing layer over the III-As layer; and
   forming, by an Sb-based optoelectronic device over the buffer layer, wherein:
      the buffer layer provides a transition in lattice constant between the silicon-based substrate and the Sb-based optoelectronic device.

13. The method of claim 12, wherein forming the Ge-based layer comprises using chemical vapor deposition (CVD).

14. The method of claim 12, wherein forming the III-As layer comprises using molecular beam epitaxy (MBE).

15. The method of claim 12, wherein forming the Sb-containing layer comprises using molecular beam epitaxy (MBE).

16. The method of claim 12, wherein forming the Sb-based optoelectronic device comprises using molecular beam epitaxy (MBE).

17. The method of claim 12, wherein forming the Ge-based layer over the silicon-based substrate comprises forming a Ge—Si substrate in a first reaction process, and wherein forming a III-As layer over the Ge-based layer comprises forming the III-As layer over the Ge—Si substrate in a second reaction process.

* * * * *

UNITED STATES PATENT AND TRADEMARK OFFICE
CERTIFICATE OF CORRECTION

PATENT NO. : 11,069,825 B2  
APPLICATION NO. : 16/424292  
DATED : July 20, 2021  
INVENTOR(S) : Liu et al.

Page 1 of 1

It is certified that error appears in the above-identified patent and that said Letters Patent is hereby corrected as shown below:

In the Claims

In Column 8, Claim 1, Line 39, delete "a metamorphic-epitaxial III-Sb" and replace with --an epitaxial Sb-containing--.

In Column 8, Claim 1, Line 41, delete "a metamorphic-epitaxial" and replace with --an epitaxial--.

In Column 8, Claim 1, Line 44, delete "transitions" and replace with --transition--.

In Column 9, Claim 10, Line 14, delete "InxAl$_y$Ga$_{1-x-y}$As$_z$Sb$_{1-z}$" and replace with --In$_x$Al$_y$Ga$_{1-x-y}$As$_z$Sb$_{1-z}$--.

In Column 9, Claim 12, Line 23, delete "over" and replace with --formed over--.

In Column 10, Claim 12, Line 4, delete "by" and replace with --by epitaxy--.

Signed and Sealed this  
Seventh Day of September, 2021

Drew Hirshfeld  
*Performing the Functions and Duties of the*  
*Under Secretary of Commerce for Intellectual Property and*  
*Director of the United States Patent and Trademark Office*